US007565018B2

(12) United States Patent
Srinivasan

(10) Patent No.: US 7,565,018 B2
(45) Date of Patent: Jul. 21, 2009

(54) ADAPTIVE CODING AND DECODING OF WIDE-RANGE COEFFICIENTS

(75) Inventor: Sridhar Srinivasan, Redmond, WA (US)

(73) Assignee: Microsoft Corporation, Redmond, WA (US)

( * ) Notice: Subject to any disclaimer, the term of this patent is extended or adjusted under 35 U.S.C. 154(b) by 699 days.

(21) Appl. No.: 11/203,010

(22) Filed: Aug. 12, 2005

(65) Prior Publication Data

US 2007/0036443 A1 Feb. 15, 2007

(51) Int. Cl.
*G06K 9/36* (2006.01)
*G06K 9/46* (2006.01)

(52) U.S. Cl. .................................. 382/232; 382/239
(58) Field of Classification Search .................. 382/238, 382/232, 239; 375/240.2
See application file for complete search history.

(56) References Cited

U.S. PATENT DOCUMENTS

| | | | |
|---|---|---|---|
| 4,420,771 A | 12/1983 | Pirsch | |
| 4,698,672 A | 10/1987 | Chen | |
| 4,730,348 A | 3/1988 | MacCrisken | |
| 4,792,981 A | 12/1988 | Cahill et al. | |
| 4,813,056 A | 3/1989 | Fedele | |
| 4,901,075 A | 2/1990 | Vogel | |
| 4,968,135 A | 11/1990 | Wallace et al. | |
| 5,043,919 A | 8/1991 | Callaway et al. | |
| 5,089,818 A | 2/1992 | Mahieux et al. | |
| 5,109,451 A | 4/1992 | Aono et al. | |
| 5,128,758 A | 7/1992 | Azadegan | |
| 5,146,324 A | 9/1992 | Miller et al. | |
| 5,179,442 A | 1/1993 | Azadegan | |
| 5,227,788 A | 7/1993 | Johnston | |
| 5,227,878 A | 7/1993 | Puri et al. | |

(Continued)

FOREIGN PATENT DOCUMENTS

EP 0 540 350 5/1993

(Continued)

OTHER PUBLICATIONS

Chiang et al., "A Radix-2 Non-Restoring 32-b/32-b Ring Divider with Asynchronous Control Scheme," Tamkang Journal of Science and Engineering, vol. 2, No. 1, pp. 37-43 (1999).

(Continued)

*Primary Examiner*—Samir A. Ahmed
*Assistant Examiner*—Li Liu
(74) *Attorney, Agent, or Firm*—Klarquist Sparkman, LLP

(57) ABSTRACT

A block transform-based digital media codec more efficiently encodes wide dynamic range transform coefficients in two parts: a normalized coefficient and bin address. The normalized coefficient relates to a grouping of coefficient values of the wide dynamic range into bins, whereas the bin address is an index of the coefficient value within a bin. With careful selection of the bin size, the normalized coefficients have a probability distribution more similar to narrow range transform coefficients, which is better suited to variable length entropy coding. The codec uses variable length entropy coding to encode the normalized coefficients in a "core" of the compressed bitstream, and fixed length coding to encode the bin address as a separate optional layer that can be omitted. The codec further adaptively varies the bin size of the grouping based on a backward adaptation process to adjust the normalized coefficients toward a probability distribution well suited for efficient variable length entropy coding.

23 Claims, 11 Drawing Sheets

U.S. PATENT DOCUMENTS

| | | |
|---|---|---|
| 5,266,941 A | 11/1993 | Akeley et al. |
| 5,270,832 A | 12/1993 | Balkanski et al. |
| 5,376,968 A | 12/1994 | Wu et al. |
| 5,381,144 A | 1/1995 | Wilson et al. |
| 5,394,170 A | 2/1995 | Akeley et al. |
| 5,400,075 A | 3/1995 | Savatier |
| 5,408,234 A | 4/1995 | Chu |
| 5,457,495 A | 10/1995 | Hartung |
| 5,461,421 A | 10/1995 | Moon |
| 5,467,134 A | 11/1995 | Laney |
| 5,481,553 A | 1/1996 | Suzuki |
| 5,493,407 A | 2/1996 | Takahara |
| 5,504,591 A | 4/1996 | Dujari |
| 5,508,816 A | 4/1996 | Ueda et al. |
| 5,533,140 A | 7/1996 | Sirat et al. |
| 5,535,305 A | 7/1996 | Acero et al. |
| 5,544,286 A | 8/1996 | Laney |
| 5,559,557 A | 9/1996 | Kato et al. |
| 5,568,167 A | 10/1996 | Galbi et al. |
| 5,574,449 A | 11/1996 | Golin |
| 5,579,430 A | 11/1996 | Grill et al. |
| 5,592,584 A | 1/1997 | Ferreira et al. |
| 5,627,938 A | 5/1997 | Johnston |
| 5,654,706 A | 8/1997 | Jeong et al. |
| 5,661,755 A | 8/1997 | Van de Kerkhof |
| 5,664,057 A | 9/1997 | Crossman et al. |
| 5,714,950 A | 2/1998 | Jeong et al. |
| 5,717,821 A | 2/1998 | Tsutsui |
| 5,732,156 A * | 3/1998 | Watanabe et al. ............ 382/239 |
| 5,748,789 A | 5/1998 | Lee et al. |
| 5,793,897 A | 8/1998 | Jo et al. |
| 5,802,213 A | 9/1998 | Gardos |
| 5,812,971 A | 9/1998 | Herre |
| 5,819,215 A | 10/1998 | Dobson et al. |
| 5,825,830 A | 10/1998 | Kopf |
| 5,825,979 A | 10/1998 | Tsutsui et al. |
| 5,828,426 A | 10/1998 | Yu |
| 5,831,559 A | 11/1998 | Agarwal et al. |
| 5,835,144 A | 11/1998 | Matsumura |
| 5,844,508 A | 12/1998 | Murashita et al. |
| 5,850,482 A | 12/1998 | Meany et al. |
| 5,883,633 A | 3/1999 | Gill et al. |
| 5,884,269 A | 3/1999 | Cellier et al. |
| 5,889,891 A | 3/1999 | Gersho et al. |
| 5,946,043 A | 8/1999 | Lee et al. |
| 5,969,650 A | 10/1999 | Wilson et al. |
| 5,974,184 A | 10/1999 | Eifrig et al. |
| 5,974,380 A | 10/1999 | Smyth et al. |
| 5,982,437 A | 11/1999 | Okazaki |
| 5,983,172 A * | 11/1999 | Takashima et al. .......... 704/203 |
| 5,990,960 A | 11/1999 | Murakami |
| 5,991,451 A | 11/1999 | Keith et al. |
| 5,995,670 A | 11/1999 | Zabinsky |
| 6,002,439 A | 12/1999 | Murakami |
| 6,026,195 A | 2/2000 | Eifrig et al. |
| 6,038,536 A | 3/2000 | Haroun et al. |
| 6,041,302 A | 3/2000 | Bruekers |
| 6,049,630 A | 4/2000 | Wang et al. |
| 6,054,943 A | 4/2000 | Lawrence |
| 6,078,691 A | 6/2000 | Luttmer |
| 6,097,759 A | 8/2000 | Murakami |
| 6,097,880 A * | 8/2000 | Koyata ....................... 386/112 |
| 6,100,825 A | 8/2000 | Sedluk |
| 6,111,914 A | 8/2000 | Bist |
| 6,148,109 A | 11/2000 | Boon |
| 6,154,572 A | 11/2000 | Chaddha |
| 6,195,465 B1 | 2/2001 | Zandi et al. |
| 6,205,256 B1 | 3/2001 | Chaddha |
| 6,215,910 B1 | 4/2001 | Chaddha |
| 6,223,162 B1 | 4/2001 | Chen |
| 6,226,407 B1 | 5/2001 | Zabih et al. |
| 6,233,017 B1 | 5/2001 | Chaddha |
| 6,253,165 B1 | 6/2001 | Malvar |
| 6,259,810 B1 | 7/2001 | Gill et al. |
| 6,272,175 B1 | 8/2001 | Sriram et al. |
| 6,292,588 B1 | 9/2001 | Shen |
| 6,300,888 B1 | 10/2001 | Chen |
| 6,304,928 B1 | 10/2001 | Mairs et al. |
| 6,337,881 B1 | 1/2002 | Chaddha |
| 6,341,165 B1 | 1/2002 | Gbur |
| 6,345,123 B1 | 2/2002 | Boon |
| 6,349,152 B1 | 2/2002 | Chaddha |
| 6,360,019 B1 | 3/2002 | Chaddha |
| 6,377,930 B1 | 4/2002 | Chen |
| 6,392,705 B1 | 5/2002 | Chaddha |
| 6,404,931 B1 | 6/2002 | Chen |
| 6,408,029 B1 | 6/2002 | McVeigh et al. |
| 6,420,980 B1 | 7/2002 | Ejima |
| 6,421,738 B1 | 7/2002 | Ratan et al. |
| 6,441,755 B1 | 8/2002 | Dietz et al. |
| 6,477,280 B1 | 11/2002 | Malvar |
| 6,487,535 B1 | 11/2002 | Smyth et al. |
| 6,493,385 B1 | 12/2002 | Sekiguchi et al. |
| 6,542,631 B1 | 4/2003 | Ishikawa |
| 6,542,863 B1 | 4/2003 | Surucu |
| 6,567,781 B1 | 5/2003 | Lafe |
| 6,573,915 B1 | 6/2003 | Sivan et al. |
| 6,580,834 B2 | 6/2003 | Li et al. |
| 6,587,057 B2 | 7/2003 | Scheuermann |
| 6,608,935 B2 | 8/2003 | Nagumo et al. |
| 6,636,168 B2 | 10/2003 | Ohashi et al. |
| 6,646,578 B1 | 11/2003 | Au |
| 6,650,784 B2 | 11/2003 | Thyagarajan |
| 6,678,419 B1 | 1/2004 | Malvar |
| 6,683,980 B1 | 1/2004 | Meier et al. |
| 6,704,360 B2 | 3/2004 | Haskell et al. |
| 6,721,700 B1 | 4/2004 | Yin |
| 6,728,317 B1 | 4/2004 | Demos |
| 6,766,293 B1 | 7/2004 | Herre |
| 6,771,777 B1 | 8/2004 | Gbur |
| 6,795,584 B2 | 9/2004 | Karczewicz et al. |
| 6,825,847 B1 | 11/2004 | Molnar et al. |
| 6,829,299 B1 | 12/2004 | Chujoh et al. |
| 6,925,249 B1 | 8/2005 | Meier et al. |
| 6,934,677 B2 | 8/2005 | Chen et al. |
| 7,016,547 B1 | 3/2006 | Smirnov |
| 7,107,212 B2 | 9/2006 | Van Der Vleuten et al. |
| 7,139,703 B2 | 11/2006 | Acero et al. |
| 7,165,028 B2 | 1/2007 | Gong |
| 7,305,174 B2 | 12/2007 | Meier et al. |
| 2002/0009145 A1 | 1/2002 | Natarajan et al. |
| 2002/0111780 A1 | 8/2002 | Sy |
| 2003/0006917 A1 | 1/2003 | Ohashi et al. |
| 2003/0033143 A1 | 2/2003 | Aronowitz |
| 2003/0085822 A1 | 5/2003 | Scheuermann |
| 2003/0115055 A1 | 6/2003 | Gong |
| 2003/0138150 A1 | 7/2003 | Srinivasan |
| 2003/0156648 A1 | 8/2003 | Holcomb et al. |
| 2003/0210163 A1 | 11/2003 | Yang |
| 2004/0044521 A1 | 3/2004 | Chen et al. |
| 2004/0044534 A1 | 3/2004 | Chen et al. |
| 2004/0049379 A1 | 3/2004 | Thumpudi et al. |
| 2004/0114810 A1 | 6/2004 | Boliek |
| 2004/0136457 A1 | 7/2004 | Funnell et al. |
| 2004/0184537 A1 | 9/2004 | Geiger et al. |
| 2005/0015249 A1 | 1/2005 | Mehrotra et al. |
| 2005/0021317 A1 | 1/2005 | Weng et al. |
| 2005/0052294 A1 | 3/2005 | Liang et al. |

FOREIGN PATENT DOCUMENTS

| | | |
|---|---|---|
| EP | 0 910 927 | 1/1998 |
| EP | 0 966 793 | 9/1998 |
| EP | 0 931 386 | 1/1999 |

| EP | 1 142 130 | 4/2003 |
| EP | 1 400 954 | 3/2004 |
| EP | 1 142 129 | 6/2004 |
| GB | 2 372 918 | 9/2002 |
| GB | 2 388 502 | 11/2003 |
| JP | 5-292481 | 11/1993 |
| JP | 6-021830 | 1/1994 |
| JP | 6-217110 | 8/1994 |
| JP | 7-274171 | 10/1995 |
| JP | 2002 204170 | 7/2002 |
| WO | WO 98/00924 | 1/1998 |

OTHER PUBLICATIONS

Search Report and Written Opinion for PCT/US06/30566 dated Sep. 28, 2007.
U.S. Appl. No. 60/341,674, filed Dec. 2001, Lee et al.
U.S. Appl. No. 60/488,710, filed Jul. 2003, Srinivasan et al.
Advanced Television Systems Committee, "ATSC Standard: Digital Audio Compression (AC-3), Revision A," 140 pp. (1995).
Bosi et al., "ISO/IEC MPEG-2 Advance Audio Coding," J. Audio Eng. Soc., vol. 45, No. 10, pp. 789-812 (1997).
Brandenburg, "ASPEC Coding," *AES 10th International Conference*, pp. 81-90 (1991).
Chung et al., "A Novel Memory-efficient Huffman Decoding Algorithm and its Implementation," Signal Processing 62, pp. 207-213 (1997).
Cui et al., "A novel VLC based on second-run-level coding and dynamic truncation," *Proc. SPIE*, vol. 6077, pp. 607726-1 to 607726-9 (2006).
De Agostino et al., "Parallel Algorithms for Optimal Compression using Dictionaries with the Prefix Property," *Proc. Data Compression Conference '92, IEEE Computer Society Press*, pp. 52-62 (1992).
Gailly, "comp.compression Frequently Asked Questions (part 1/3)," 64 pp., document marked Sep. 5, 1999 [Downloaded from the World Wide Web on Sep. 5, 2007].
Gersho et al., "Vector Quantization and Signal Compression," pp. 259-305 (1992).
Gibson et al., *Digital Compression for Multimedia*, "Chapter 2: Lossless Source Coding," Morgan Kaufmann Publishers, Inc., San Francisco, pp. 17-61 (1998).
Gibson et al., *Digital Compression for Multimedia*, "Chapter 7: Frequency Domain Coding," Morgan Kaufmann Publishers, Inc., pp. 227-262 (1998).
Gill et al., "Creating High-Quality Content with Microsoft Windows Media Encoder 7," 4 pp. (2000) [ Downloaded from the World Wide Web on May 1, 2002].
Hui et al., "Matsushita Algorithm for Coding of Moving Picture Information," ISO/IEC-JTC1/SC29/WG11, MPEG91/217, 76 pp. (Nov. 1991).
International Search Report and Written Opinion for PCT/US06/30563, dated Oct. 17, 2007, 8 pages.
Ishii et al., "Parallel Variable Length Decoding with Inverse Quantization for Software MPEG-2 Decoders," IEEE Signal Processing Systems, pp. 500-509 (1997).
ISO/IEC, "ISO/IEC 11172-2, Information Technology—Coding of Moving Pictures and Associated Audio for Digital Storage Media at up to About 1.5 Mbit/s—Part 2: Video," 112 pp. (1993).
"ISO/IEC 11172-3, Information Technology—Coding of Moving Pictures and Associated Audio for Digital Storage Media at Up to Ab out 1.5 Mbit/s—Part 3: Audio," 154 pp. (1993).
"ISO/IEC 13818-7, Information Technology—Generic Coding of Moving Pictures and Associated Audio Information—Part 7: Advanced Audio Coding (AAC)," 174 pp. (1997).
ISO/IEC, "JTC1/SC29/WG11 N2202, Information Technology—Coding of Audio-Visual Objects: Visual, ISO/IEC 14496-2," 329 pp. (1998).
ITU-T, "ITU-T Recommendation H.261, Video Codec for Audiovisual Services at $p \times 64$ kbits," 25 pp. (1993).
ITU-T, "ITU-T Recommendation H.262, Information Technology—Generic Coding of Moving Pictures and Associated Audio Information: Video," 205 pp. (1995).
ITU-T, "ITU-T Recommendation H.263, Video coding for low bit rate communication," 162 pp. (1998).
Jeong et al., "Adaptive Huffman Coding of 2-D DCT Coefficients for Image Sequence Compression," *Signal Processing: Image Communication*, vol. 7, 11 pp. (1995).
Joint Video Team (JVT) of ISO/IEC MPEG & ITU-T VCEG, "Joint Final Committee Draft (JFCD) of Joint Video Specification," JVT-D157, 207 pp. (Aug. 2002).
Joint Video Team (JVT) of ISO/IEC MPEG & ITU-T VCEG, "Draft ITU-T Recommendation and Final Draft International Standard of Joint Video Specification (ITU-T Rec. H.264, ISO/IEC 14496-10 AVC)," 253 pp. (May 2003).
Li et al., "Optimal Linear Interpolation Coding for Server-Based Computing," *Proc. IEEE Int'l Conf. on Communications*, 5 pp. (Apr.-May 2002).
Matthias, "An Overview of Microsoft Windows Media Screen Technology," 3 pp. (2000) [ Downloaded from the World Wide Web on May 1, 2002].
Microsoft Corporation, "Microsoft Debuts New Windows Media Player 9 Series, Redefining Digital Media on the PC," 4 pp. (Sep. 4, 2002) [Downloaded from the World Wide Web on Jul. 16, 2004].
Mook, "Next-Gen Windows Media Player Leaks to the Web," *BetaNews*, 18 pp. (Jul. 2002) [Downloaded from the World Wide Web on Mar. 16, 2004].
Najafzadeh-Azghandi, "Perceptual Coding of Narrowband Audio Signals," Thesis, 139 pp. (Apr. 2000).
Nelson, *The Data Compression Book*, "Huffman One Better: Arithmetic Coding," Chapter 5, pp. 123-165 (1992).
OPTX International, "OPTX Improves Technology-Based Training with Screen Watch™ 3.0. Versatile Screen Capture Software Adds High Color and Live Webcast Support," 1 p., document marked Feb. 15, 2001 [Downloaded from the World Wide Web on Sep. 22, 2005].
OPTX International, "OPTX International Marks One Year Anniversary of Screen Watch With Release of New 2.0 Version," 1 p., document marked May 16, 2000 [Downloaded from the World Wide Web on Sep. 22, 2005].
OPTX International, "New Screen Watch™ 4.0 Clikc and Stream™ Wizard from OPTX International Makes Workplace Communication Effortless," 1 p., document marked Sep. 24, 2001 [Downloaded from the World Wide Web on Sep. 22, 2005].
Palmer et al., "Shared Desktop: A Collaborative Tool for Sharing 3-D Applications Among Different Window Systems," *Digital Tech. Journal*, vol. 9, No. 3, pp. 42-49 (1997).
Printouts of FTP directories from http://ftp3.itu.ch, 8 pp. [Downloaded from the World Wide Web on Sep. 20, 2005].
Reader, "History of MPEG Video Compression—Ver. 4.0," 99 pp., document marked Dec. 16, 2003.
Schaar-Mitrea et al., "Hybrid Compresion of Video with Graphics in DTV Communication Systems," *IEEE Trans. on Consumer Electronics*, pp. 1007-1017 (2000).
Shamoon et al., "A Rapidly Adaptive Lossless Compression Algorithm for High Fidelity Audio Coding," *IEEE Data Compression Conf.*, pp. 430-439 (Mar. 1994).
Sullivan et al., "The H.264/AVC Advanced Video Coding Standard: Overview and Introduction to the Fidelity Range Extensions," 21 pp. (Aug. 2004).
Techsmith Corporation, "Techsmith Camtasia Screen Recorder SDK," 2 pp. (2001).
Techsmith Corporation, "Camtasia Feature of the Week: Quick Capture," 2 pp., document dated Jan. 4, 2001 [Downloaded from the World Wide Web on May 9, 2002].
Techsmith Corporation, "Camtasia Screen Recorder SDK DLL API User Guide," Version 1.0, 66 pp. (2001).
Techsmith Corporation, "Camtasia v.3.0.1—README.TXT," 19 pp. (Jan. 2002).
Tu et al., "Context-Based Entropy Coding of Block Transform Coefficients for Image Compression," *IEEE Transactions on Image Processing*, vol. 11, No. 11, pp. 1271-1283 (Nov. 2002).
Wien et al., "16 Bit Adaptive Block Size Transforms," JVT-C107r1, 54 pp.
Wien, "Variable Block-Size Transforms for Hybrid Video Coding," Dissertation, 182 pp. (Feb. 2004).

ITU-T Recommendation H.264, "Series H: Audiovisual and Multimedia Systems, Infrastructure of Audiovisual Services—Coding of Moving Video," International Telecommunication Union, pp. 1-262 (May 2003).

ITU-T Recommendation T.800, "Series T: Terminals for Telematic Services," International Telecommunication Union, pp. 1-194 (Aug. 2002).

ISO/IEC 14496-2, "Coding of Audio-Visual Object—Part 2: Visual," Third Edition, pp. 1-727, (Jun. 2004).

Malvar, "Fast Progressive Image Coding without Wavelets", IEEE Data Compression Conference, Snowbird, Utah, 10 pp. (Mar. 2000).

Costa et al., "Efficient Run-Length Encoding of Binary Sources with Unknown Statistics", Technical Report No. MSR-TR-2003-95, pp. 1-10, Microsoft Research, Microsoft Corporation (Dec. 2003).

Bell et al., "Text Compression," *Prentice Hall*, pp. 105-107, 1990, Date of Publication: Jan. 16, 1990.

Davis, "The AC-3 Multichannel Coder," *Dolby Laboratories Inc.*, Audio Engineering Study, Inc., Oct. 1993.

\* cited by examiner

Figure 10

```
1000    Constants:
            MODELWEIGHT = 70
            Weight0[3] = { 240/*DC*/, 12/*LP*/, 1/*HP*/ }
            Weight1[3][16] = {   /* upto 16 channels permitted */
                { 0,240,120,80,  60,48,40,34,   30,27,24,22,   20,18,17,16 },
                { 0,12,6,4,      3,2,2,2,       2,1,1,1,       1,1,1,1 },
                { 0,16,8,5,      4,3,3,2,       2,2,2,1,       1,1,1,1 }
            }
            Weight2[6] = { 120,37,2/*YUV 420*/,
                           120,18,1/*YUV 422*/ }

Model data structure:
            CAdaptiveModel {
                FLCState    /* internal state running from -8 to 7*/
                            /* FLCState is initialized to zero */
                FLCBits     /* k */
                            /* FLCBits is initialized to 0 for highpass,
        */
                            /* 4 for lowpass and 8 for DC */
            }

Function UpdateModelMB (
            Int Band,       /* band 0/1/2 => DC/LP/HP */
            COLORFORMAT cf,/* image color format */
            Int Channels,   /* number of chroma channels <= 16 */
            Int Count[],    /* number of coefficients in luma & chroma
        bands */
            CAdaptiveModel Model)
        {

/* Normalization */
            iLaplacianMean[0] *= Weight0[Band]
            if (cf == YUV_420) {
                iLaplacianMean[1] *= Weight2[Band]
            }
            else if (cf == YUV_422) {
                iLaplacianMean[1] *= aWeight2[3 + Band]
            }
            else {
                iLaplacianMean[1] *= Weight1[Band][iChannels - 1]
                if (Band == HP)
                    iLaplacianMean[1] >>= 4
            }
            ...
```

/* Loop over luma & chroma */
    for (j = 0; j < 2; j++) {
        iLM = Count[j]
        iMS = Model.FLCState[j]

/* Calculate deviation from baseline */
        iDelta = (iLM - MODELWEIGHT) >> 2

/* Too few coefficients in the previous MB ? */
        if (iDelta < -8) {
            iDelta += 4   /* hysteresis */
            if (iDelta < -16)
                iDelta = -16
            iMS += iDelta
            if (iMS < -8) {
                if (Model.FLCBits [j] == 0)
                    iMS = -8
                else {
                    iMS = 0
                    Model.FLCBits[j]--  /* bump k down */
                }
            }
        }
/* Too many coefficients in the previous MB ? */
        else if (iDelta > 8) {
            iDelta -= 4   /* hysteresis */
            if (iDelta > 15)
                iDelta = 15
            iMS += iDelta
            if (iMS > 8) {
                iMS = 0
                Model.FLCBits [j]++    /* bump k up */
                if (Model.FLCBits [j] > 16)
                    Model.FLCBits [j] = 16
            }
        }

Model.FLCState[j] = iMS
    }
}
```

1000
(cont.)

Software 1280 Implementing Adaptive
Wide-range Coefficient Coding/Decoding

… # ADAPTIVE CODING AND DECODING OF WIDE-RANGE COEFFICIENTS

COPYRIGHT AUTHORIZATION

A portion of the disclosure of this patent document contains material that is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND

Block Transform-Based Coding

Transform coding is a compression technique used in many audio, image and video compression systems. Uncompressed digital image and video is typically represented or captured as samples of picture elements or colors at locations in an image or video frame arranged in a two-dimensional (2D) grid. This is referred to as a spatial-domain representation of the image or video. For example, a typical format for images consists of a stream of 24-bit color picture element samples arranged as a grid. Each sample is a number representing color components at a pixel location in the grid within a color space, such as RGB, or YIQ, among others. Various image and video systems may use various different color, spatial and time resolutions of sampling. Similarly, digital audio is typically represented as time-sampled audio signal stream. For example, a typical audio format consists of a stream of 16-bit amplitude samples of an audio signal taken at regular time intervals.

Uncompressed digital audio, image and video signals can consume considerable storage and transmission capacity. Transform coding reduces the size of digital audio, images and video by transforming the spatial-domain representation of the signal into a frequency-domain (or other like transform domain) representation, and then reducing resolution of certain generally less perceptible frequency components of the transform-domain representation. This generally produces much less perceptible degradation of the digital signal compared to reducing color or spatial resolution of images or video in the spatial domain, or of audio in the time domain.

More specifically, a typical block transform-based codec 100 shown in FIG. 1 divides the uncompressed digital image's pixels into fixed-size two dimensional blocks ($X_1, \ldots X_n$), each block possibly overlapping with other blocks. A linear transform 120-121 that does spatial-frequency analysis is applied to each block, which converts the spaced samples within the block to a set of frequency (or transform) coefficients generally representing the strength of the digital signal in corresponding frequency bands over the block interval. For compression, the transform coefficients may be selectively quantized 130 (i.e., reduced in resolution, such as by dropping least significant bits of the coefficient values or otherwise mapping values in a higher resolution number set to a lower resolution), and also entropy or variable-length coded 130 into a compressed data stream. At decoding, the transform coefficients will inversely transform 170-171 to nearly reconstruct the original color/spatial sampled image/video signal (reconstructed blocks $\hat{X}_1, \ldots \hat{X}_n$).

The block transform 120-121 can be defined as a mathematical operation on a vector x of size N. Most often, the operation is a linear multiplication, producing the transform domain output y=M x, M being the transform matrix. When the input data is arbitrarily long, it is segmented into N sized vectors and a block transform is applied to each segment. For the purpose of data compression, reversible block transforms are chosen. In other words, the matrix M is invertible. In multiple dimensions (e.g., for image and video), block transforms are typically implemented as separable operations. The matrix multiplication is applied separably along each dimension of the data (i.e., both rows and columns).

For compression, the transform coefficients (components of vector y) may be selectively quantized (i.e., reduced in resolution, such as by dropping least significant bits of the coefficient values or otherwise mapping values in a higher resolution number set to a lower resolution), and also entropy or variable-length coded into a compressed data stream.

At decoding in the decoder 150, the inverse of these operations (dequantization/entropy decoding 160 and inverse block transform 170-171) are applied on the decoder 150 side, as show in FIG. 1. While reconstructing the data, the inverse matrix $M^{-1}$ (inverse transform 170-171) is applied as a multiplier to the transform domain data. When applied to the transform domain data, the inverse transform nearly reconstructs the original time-domain or spatial-domain digital media.

In many block transform-based coding applications, the transform is desirably reversible to support both lossy and lossless compression depending on the quantization factor. With no quantization (generally represented as a quantization factor of 1) for example, a codec utilizing a reversible transform can exactly reproduce the input data at decoding. However, the requirement of reversibility in these applications constrains the choice of transforms upon which the codec can be designed.

Many image and video compression systems, such as MPEG and Windows Media, among others, utilize transforms based on the Discrete Cosine Transform (DCT). The DCT is known to have favorable energy compaction properties that result in near-optimal data compression. In these compression systems, the inverse DCT (IDCT) is employed in the reconstruction loops in both the encoder and the decoder of the compression system for reconstructing individual image blocks.

Entropy Coding of Wide-Range Transform Coefficients

Wide dynamic range input data leads to even wider dynamic range transform coefficients generated during the process of encoding an image. For instance, the transform coefficients generated by an N×N DCT operation have a dynamic range greater than N times the dynamic range of the original data. With small or unity quantization factors (used to realize low-loss or lossless compression), the range of quantized transform coefficients is also large. Statistically, these coefficients have a Laplacian distribution as shown in FIGS. 2 and 3. FIG. 2 shows a Laplacian distribution for wide dynamic range coefficients. FIG. 3 shows a Laplacian distribution for typical narrow dynamic range coefficients.

Conventional transform coding is tuned for a small dynamic range of input data (typically 8 bits), and relatively large quantizers (such as numeric values of 4 and above). FIG. 3 is therefore representative of the distribution of transform coefficients in such conventional transform coding. Further, the entropy encoding employed with such conventional transform coding can be a variant of run-level encoding, where a succession of zeroes is encoded together with a non-zero symbol. This can be an effective means to represent runs of zeroes (which occur with high probability), as well as capturing inter-symbol correlations.

On the other hand, conventional transform coding is less suited to compressing wide dynamic range distributions such as that shown in FIG. 2. Although the symbols are zero with higher probability than any other value (i.e., the distribution peaks at zero), the probability of a coefficient being exactly zero is miniscule for the wide dynamic range distribution. Consequently, zeroes do not occur frequently, and run length entropy coding techniques that are based on the number of zeroes between successive non-zero coefficients are highly inefficient for wide dynamic range input data.

The wide dynamic range distribution also has an increased alphabet of symbols, as compared to the narrow range distribution. Due to this increased symbol alphabet, the entropy table(s) used to encode the symbols will need to be large. Otherwise, many of the symbols will end up being escape coded, which is inefficient. The larger tables require more memory and may also result in higher complexity.

The conventional transform coding therefore lacks versatility—working well for input data with the narrow dynamic range distribution, but not on the wide dynamic range distribution.

SUMMARY

A digital media coding and decoding technique and realization of the technique in a digital media codec described herein achieves more effective compression of wide dynamic range transform coefficients. For example, one exemplary block transform-based digital media codec illustrated herein represents wide dynamic range transform coefficients in two parts: a normalized coefficient and bin address. The normalized coefficient relates to a grouping of coefficient values of the wide dynamic range into bins, whereas the bin address is an index of the coefficient value within a bin. With careful selection of the bin size, the normalized coefficient part of the transform coefficients has a probability distribution more similar to that of narrow range transform coefficients, which is better suited to variable length entropy coding.

The exemplary codec uses variable length entropy coding to encode the normalized coefficients in a "core" of the compressed bitstream, and fixed length coding to encode the bin address as a separate optional layer that can be omitted. Even with the bin address layer omitted, the codec can decode the bitstream and reconstruct an approximation of the input digital media data. The grouping of the transform coefficients in bins has a similar effect to quantization of the transform coefficients to a narrower dynamic range.

The codec further adaptively varies the bin size of the grouping based on a backward adaptation process to adjust the normalized coefficients toward a probability distribution well suited for efficient variable length entropy coding. In the exemplary codec, the adaptation is based on a count of the non-zero normalized coefficients in previous blocks. In this way, the adaptation depends only on information in the core bitstream, which does not violate the constraint that the layer containing the bin address can be selectively omitted.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

BRIEF DESCRIPTION OF THE DRAWINGS

FIGS. 10 and 11 are a pseudo-code listing of the adaptation process of FIG. 9.

DETAILED DESCRIPTION

The following description relates to coding and decoding techniques that adaptively adjust for more efficient entropy coding of wide-range transform coefficients. The following description describes an example implementation of the technique in the context of a digital media compression system or codec. The digital media system codes digital media data in a compressed form for transmission or storage, and decodes the data for playback or other processing. For purposes of illustration, this exemplary compression system incorporating this adaptive coding of wide range coefficients is an image or video compression system. Alternatively, the technique also can be incorporated into compression systems or codecs for other 2D data. The adaptive coding of wide range coefficients technique does not require that the digital media compression system encodes the compressed digital media data in a particular coding format.

1. Encoder/Decoder

Figure 4:
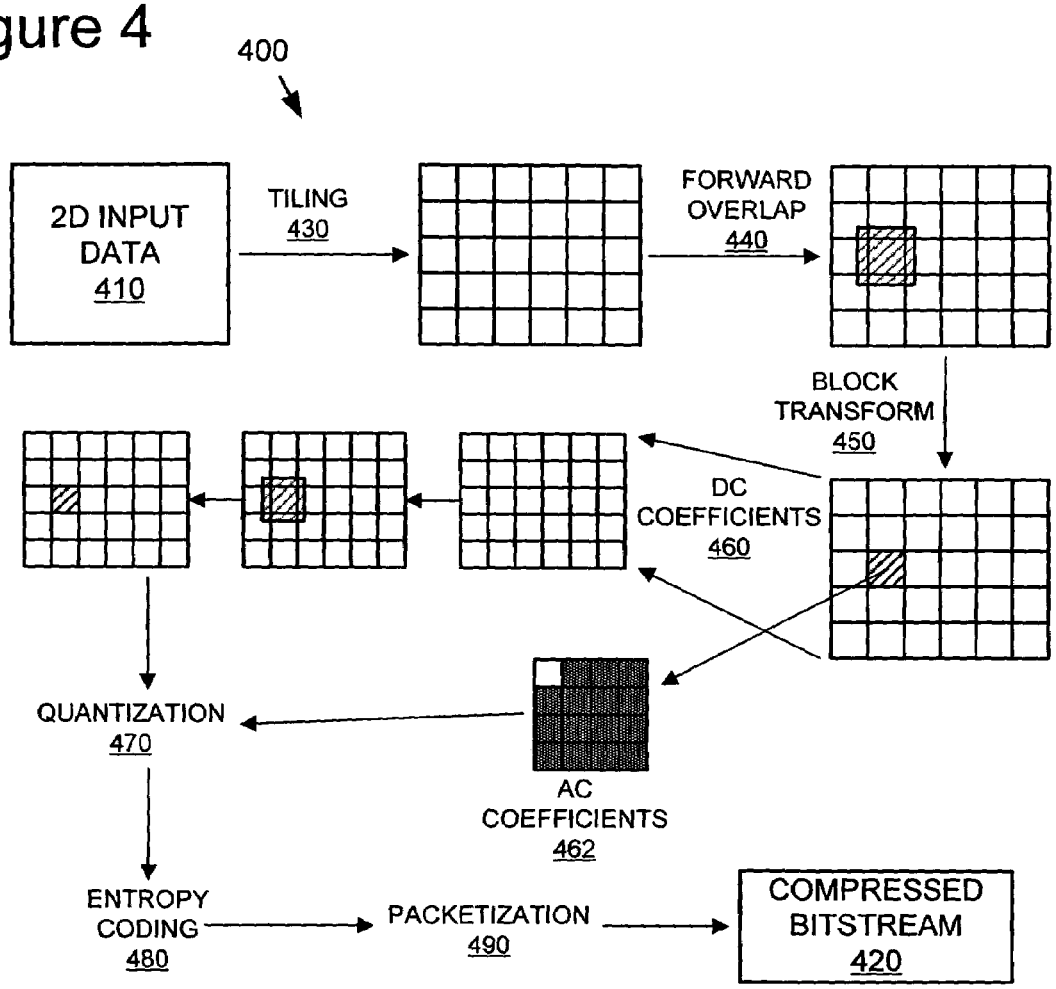
FIG. 4 is a flow diagram of a representative encoder incorporating the adaptive coding of wide range coefficients.
Figure 5:
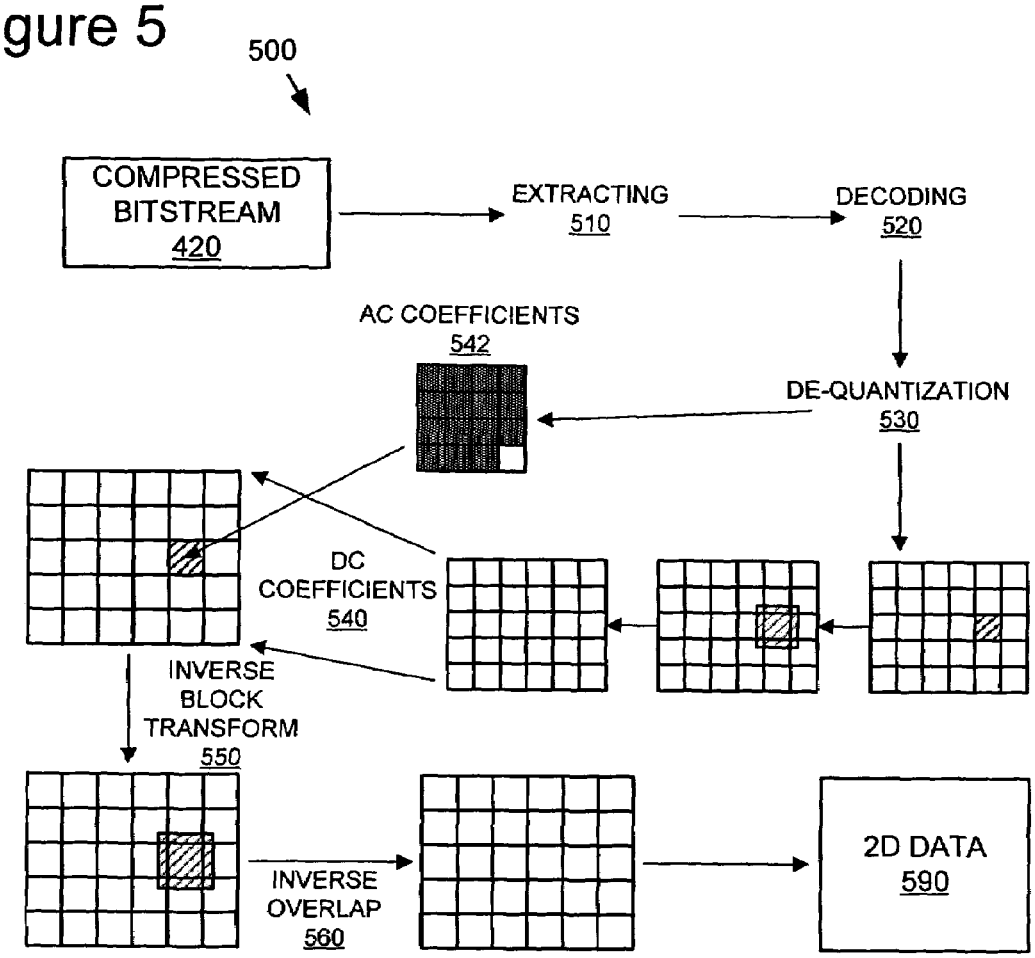
FIG. 5 is a flow diagram of a decoder incorporating the decoding of adaptively coded wide range coefficients.

FIGS. 4 and 5 are a generalized diagram of the processes employed in a representative 2-dimensional (2D) data encoder 400 and decoder 500. The diagrams present a generalized or simplified illustration of a compression system incorporating the 2D data encoder and decoder that implement the adaptive coding of wide range coefficients. In alternative compression systems using the adaptive coding of wide range coefficients, additional or fewer processes than those illustrated in this representative encoder and decoder can be used for the 2D data compression. For example, some encoders/decoders may also include color conversion, color formats, scalable coding, lossless coding, macroblock modes, etc. The compression system (encoder and decoder) can provide lossless and/or lossy compression of the 2D data, depending on the quantization which may be based on a quantization parameter varying from lossless to lossy.

The 2D data encoder 400 produces a compressed bitstream 420 that is a more compact representation (for typical input) of 2D data 410 presented as input to the encoder. For example, the 2D data input can be an image, a frame of a video sequence, or other data having two dimensions. The 2D data encoder tiles 430 the input data into macroblocks, which are 16×16 pixels in size in this representative encoder. The 2D data encoder further tiles each macroblock into 4×4 blocks. A "forward overlap" operator 440 is applied to each edge between blocks, after which each 4×4 block is transformed using a block transform 450. This block transform 450 can be the reversible, scale-free 2D transform described by Srinivasan, U.S. Pat. No. 7,471,850, entitled, "Reversible Transform For Lossy And Lossless 2-D Data Compression," issued Dec. 30, 2008. The overlap operator 440 can be the reversible overlap operator described by Tu et al., U.S. Pat. No. 7,428,342, entitled, "Reversible Overlap Operator for Efficient Lossless Data Compression," issued Sep. 23, 2008; and by Tu et al., U.S. Pat. No. 7,305,139, entitled, "Reversible 2-Dimensional Pre-/Post-Filtering For Lapped Biorthogonal Transform," issued Dec. 4, 2007. Alternatively, the discrete cosine transform or other block transforms and overlap operators can be used. Subsequent to the transform, the DC coefficient 460 of each 4×4 transform block is subject to a similar processing chain (tiling, forward overlap, followed by 4×4 block transform). The resulting DC transform coefficients and the AC transform coefficients are quantized 470, entropy coded 480 and packetized 490.

The decoder performs the reverse process. On the decoder side, the transform coefficient bits are extracted 510 from their respective packets, from which the coefficients are themselves decoded 520 and dequantized 530. The DC coefficients 540 are regenerated by applying an inverse transform, and the plane of DC coefficients is "inverse overlapped" using a suitable smoothing operator applied across the DC block edges. Subsequently, the entire data is regenerated by applying the 4×4 inverse transform 550 to the DC coefficients, and the AC coefficients 542 decoded from the bitstream. Finally, the block edges in the resulting image planes are inverse overlap filtered 560. This produces a reconstructed 2D data output.

Figure 1:
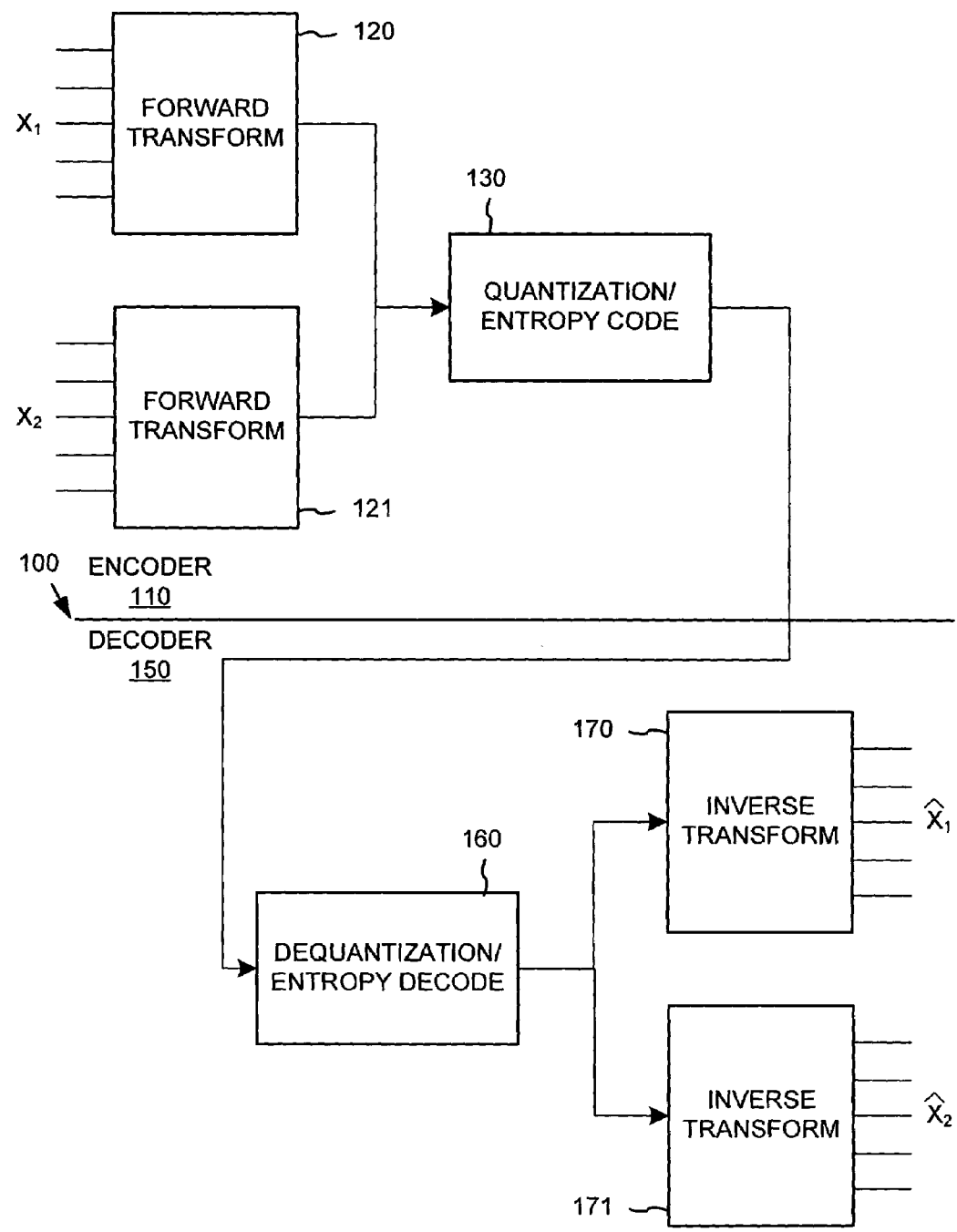
FIG. 1 is a block diagram of a conventional block transform-based codec in the prior art.
Figure 2:
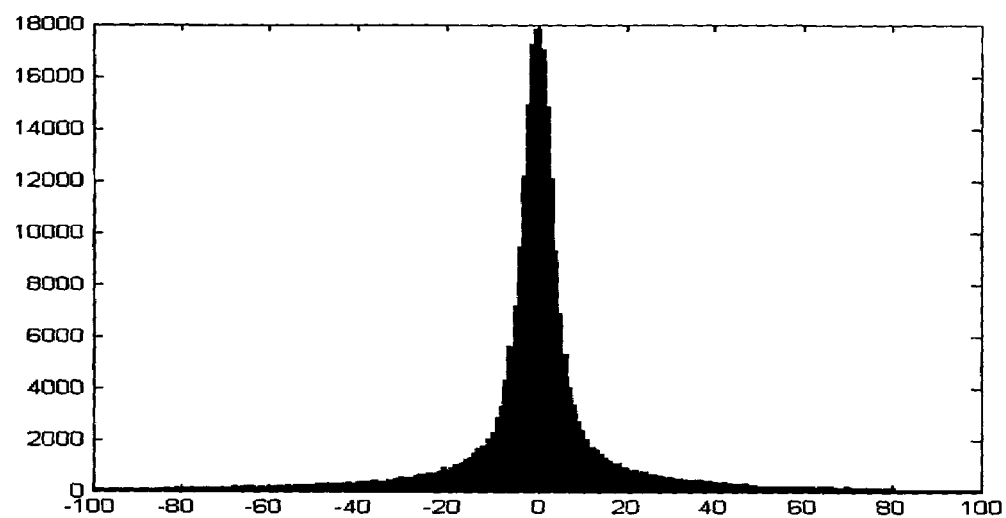
FIG. 2 is a histogram showing a distribution of transform coefficients having a wide dynamic range.

In an exemplary implementation, the encoder 400 (FIG. 2) compresses an input image into the compressed bitstream 420 (e.g., a file), and the decoder 500 (FIG. 5) reconstructs the original input or an approximation thereof, based on whether lossless or lossy coding is employed. The process of encoding involves the application of a forward lapped transform (LT) discussed below, which is implemented with reversible 2-dimensional pre-/post-filtering also described more fully below. The decoding process involves the application of the inverse lapped transform (ILT) using the reversible 2-dimensional pre-/post-filtering.

The illustrated LT and the ILT are inverses of each other, in an exact sense, and therefore can be collectively referred to as a reversible lapped transform. As a reversible transform, the LT/ILT pair can be used for lossless image compression.

The input data 410 compressed by the illustrated encoder 400/decoder 500 can be images of various color formats (e.g., RGB/YUV4:4:4 or YUV4:2:0 color image formats). Typically, the input image always has a luminance (Y) component. If it is a RGB/YUV4:4:4 or YUV4:2:0 image, the image also has chrominance components, such as a U component and a V component. The separate color planes or components of the image can have different spatial resolutions. In case of an input image in the YUV 4:2:0 color format for example, the U and V components have half of the width and height of the Y component.

As discussed above, the encoder 400 tiles the input image or picture into macroblocks. In an exemplary implementation, the encoder 400 tiles the input image into 16×16 macroblocks in the Y channel (which may be 16×16 or 8×8 areas in the U and V channels depending on the color format). Each macroblock color plane is tiled into 4×4 regions or blocks.

Therefore, a macroblock is composed for the various color formats in the following manner for this exemplary encoder implementation:
1. For a grayscale image, each macroblock contains 16 4×4 luminance (Y) blocks.
2. For a YUV4:2:0 format color image, each macroblock contains 16 4×4 Y blocks, and 4 each 4×4 chrominance (U and V) blocks.
3. For a RGB or YUV4:4:4 color image, each macroblock contains 16 blocks each of Y, U and V channels.

2. Adaptive Coding of Wide-Range Coefficients

In the case of wide dynamic range data, especially decorrelated transform data (such as, the coefficients 460, 462 in the encoder of FIG. 4), a significant number of lower order bits are unpredictable and "noisy." In other words, there is not much correlation in the lower order bits that can be used for efficient entropy coding. The bits have a high entropy, approaching 1 bit for every bit encoded.

2.1 Grouping

Figure 3:
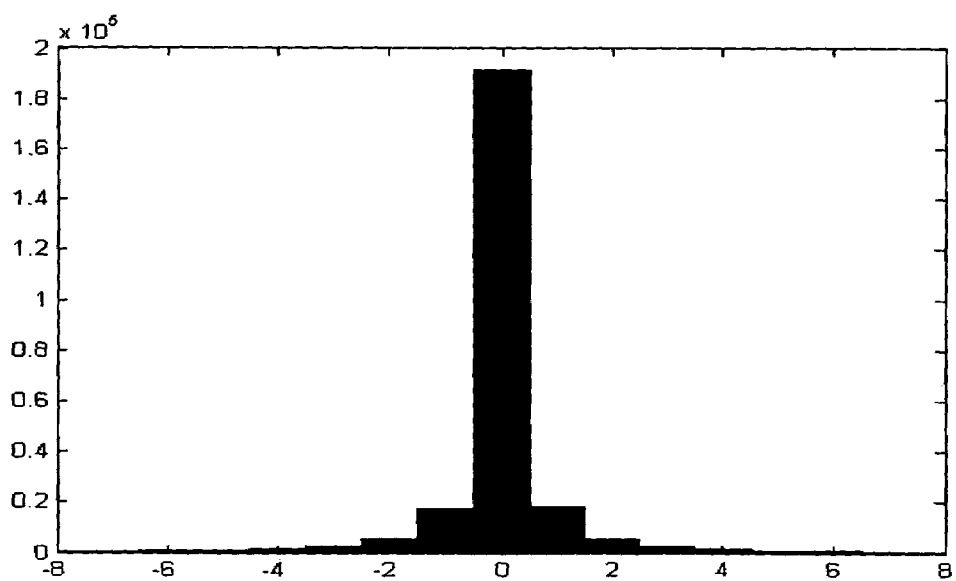
FIG. 3 is a histogram showing a distribution of narrow range coefficients.

Further, the Laplacian probability distribution function of wide range transform coefficients shown in FIG. 3 is given by $$\frac{\lambda}{2}e^{-\lambda|x|}$$

(for convenience, the random variable corresponding to the transform coefficients is treated as a continuous value). For wide dynamic range data, $\lambda$ is small, and the absolute mean $1/\lambda$ is large. The slope of this distribution is bounded within $\pm\frac{1}{2}(\lambda^2)$, which is very small. This means that the probability of a transform coefficient being equal to x is very close to the probability of x+$\xi$ for a small shift $\xi$. In the discrete domain, this translates to the claim, "the probability of a transform coefficient taking on adjacent values j and (j+1) is almost identical."

Figure 6:
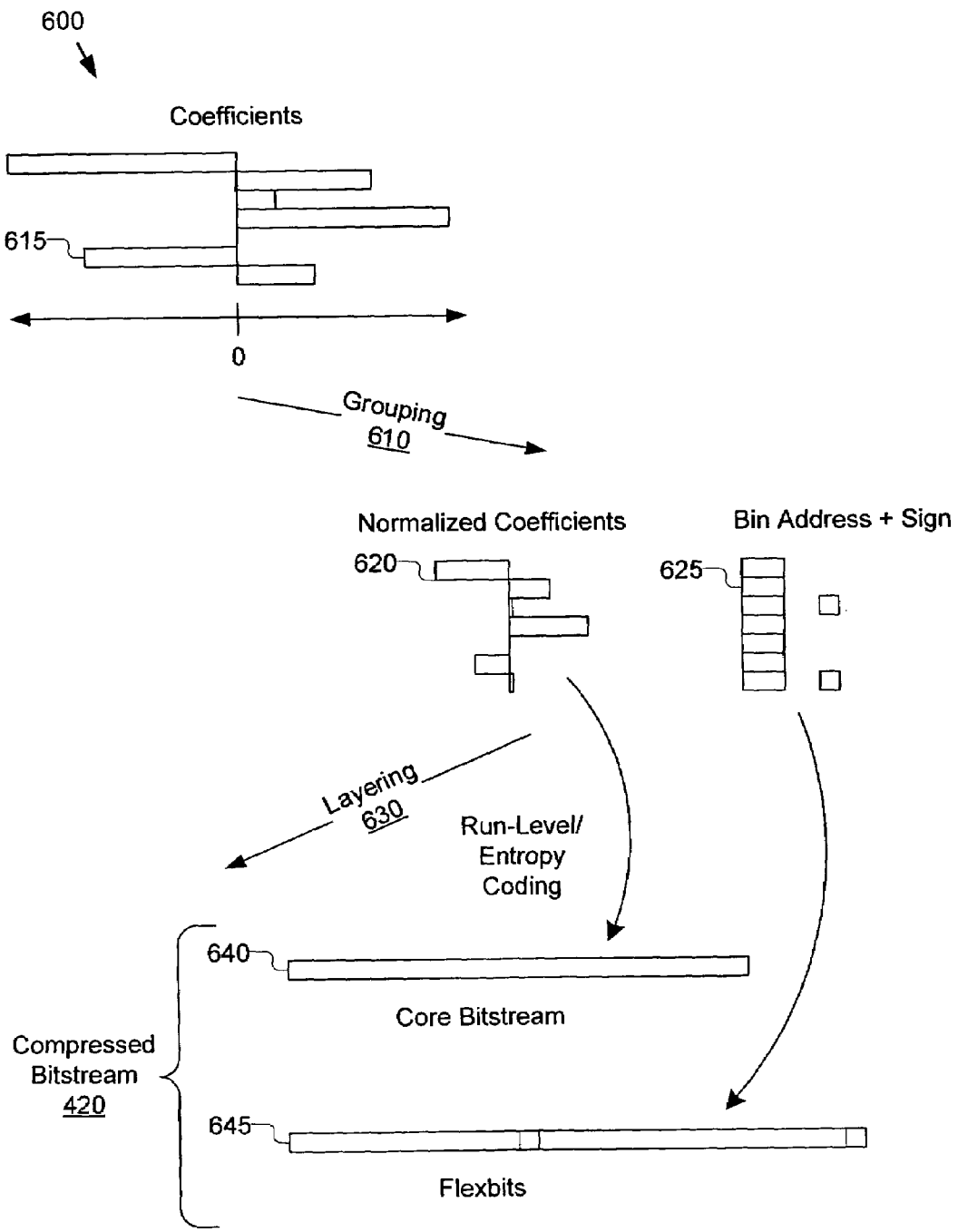
FIG. 6 is a flow diagram illustrating grouping and layering of transform coefficient in the adaptive coding of wide range coefficients, such as in the encoder of FIG. 4.

With reference now to FIG. 6, the adaptive coding of wide-range coefficients performs a grouping 610 of successive symbols of the alphabet into "bins" of N symbols. The number of symbols per bin can be any number N. For practicality, however, the number N is desirably a power of 2 (i.e., N=$2^k$), so that the index or address of a coefficient within a bin can be encoded efficiently as a fixed length code. For example, the symbols can be grouped into pairs, such that a symbol can be identified as the index of the pair, together with the index of the symbol within the pair.

This grouping has the benefit that with a suitable choice of N, the probability distribution of the bin index for wide range coefficients more closely resembles the probability distribution of narrow range data, e.g., that shown in FIG. 3. The grouping is mathematically similar to a quantization operation. This means that the bin index can be efficiently encoded using variable length entropy coding techniques that work best with data having the narrow range probability distribution.

Based on the grouping of coefficients into bins, the encoder can then encode a transform coefficient 615 using an index of its bin (also referred to herein as the normalized coefficient 620) and its address within the bin (referred to herein as the bin address 625). The normalized coefficient is encoded using variable length entropy coding, while the bin address is encoded by means of a fixed length code.

The choice of N (or equivalently, the number of bits k for the fixed length coding of the bin address) determines the granularity of grouping. In general, the wider the range of the transform coefficients, the larger value of k should be chosen.

When k is carefully chosen, the normalized coefficient Y is zero with high probability that matches the entropy coding scheme for Y.

As described below, the value k can be varied adaptively (in a backward-adaptive manner) in the encoder and decoder. More specifically, the value of k on both the encoder and decoder varies based on the previously encoded/decoded data only.

In one particular example of this encoding shown in FIG. 7, the encoder encodes a transform coefficient X as follows. For an initial action 710, the encoder calculates a normalized coefficient Y for the transform coefficient. In this example implementation, the normalized coefficient Y is defined as $Y=\text{sign}(X)*\text{floor}(\text{abs}(X)/N)$, for a certain choice of bin size $N=2^k$. The encoder encodes the symbol Y using an entropy code (action 720), either individually or jointly with other symbols. Next, at action 730, the encoder determines a bin address (Z) of the transform coefficient X. In this example implementation, the bin address is the remainder of the integer division of abs(X) by the bin size N, or $Z=\text{abs}(X)\%N$. The encoder encodes this value as a fixed length code of k bits at action 740. Further, in the case of a non-zero transform coefficient, the encoder also encodes the sign. More specifically, as indicated in actions 750-760, the encoder encodes the sign of the normalized coefficient (Y) when the normalized coefficient is non-zero. Further, in the case that the normalized coefficient is zero and the transform coefficient is non-zero, the encoder encodes the sign of the transform coefficient (X). Since the normalized coefficient is encoded using a variable length entropy code, it is also referred to herein as the variable length part, and the bin address (Z) is also referred to as the fixed length part. In other alternative implementations, the mathematical definitions of the normalized coefficient, bin address and sign for a transform coefficient can vary.

Figure 7:
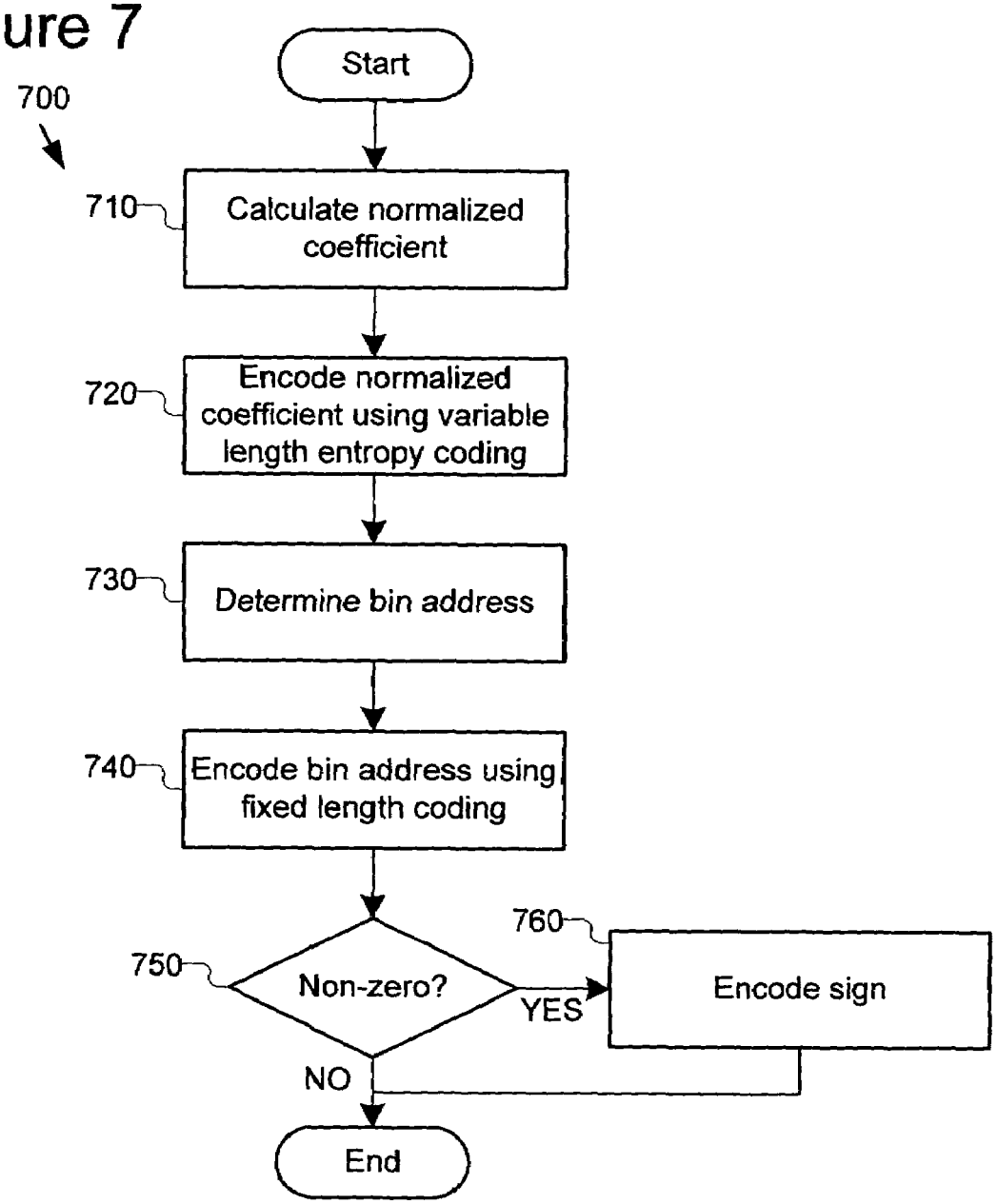
FIG. 7 is a flow chart showing a process by the encoder of FIG. 4 to encode a transform coefficient for a chosen grouping of transform coefficients in bins.
Figure 8:
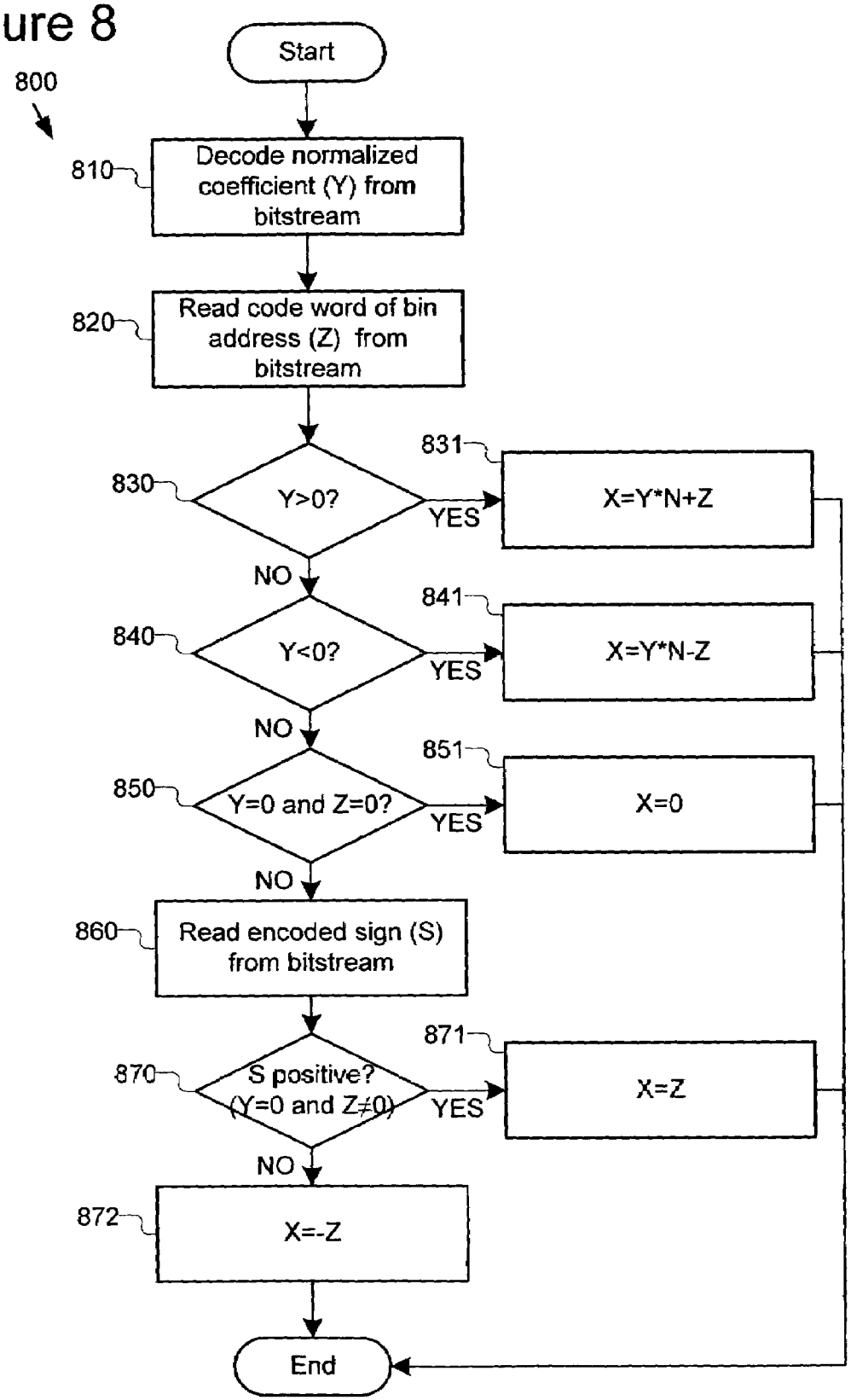
FIG. 8 is a flow chart showing a process by the decoder of FIG. 5 to reconstruct the transform coefficient encoded via the process of FIG. 7.

Continuing this example, FIG. 8 shows an example process 800 by the decoder 500 (FIG. 5) to reconstruct the transform coefficient that was encoded by the process 700 (FIG. 7). At action 810, the decoder decodes the normalized coefficient (Y) from the compressed bitstream 420 (FIG. 5), either individually or in conjunction with other symbols as defined in the block coding process. The decoder further reads the k-bit code word for the bin address and the sign (when encoded) from the compressed bitstream at action 820. At actions 830 to 872, the decoder then reconstructs the transform coefficient, as follows:

1. When Y>0 (action 830), then the transform coefficient is reconstructed as $X=Y*N+Z$ (action (831)).
2. When Y<0 (action 840), then the transform coefficient is reconstructed as $X=Y*N-Z$ (action 841).
3. When Y=0 and Z=0 (action 850), then the transform coefficient is reconstructed as X=0 (action 851).
4. When Y=0 and Z≠0, the decoder further reads the encoded sign (S) from the compressed bitstream (action 860). If the sign is positive (S=0) (action 870), then the transform coefficient is reconstructed as X=Z (action 871). Else, if the sign is negative (S=1), the transform coefficient is reconstructed as X=−Z (action 872).

2.2 Layering

With reference again to FIG. 6, the encoder and decoder desirably abstracts out the fixed length coded bin addresses 625 and sign into a separate coded layer (herein called the "Flexbits" layer 645) in the compressed bitstream 420 (FIG. 4). The normalized coefficients 620 are encoded in a layer of the core bitstream 640. This allows the encoder and/or decoder the option to downgrade or entirely drop this Flexbits portion of the encoding, as desired, to meet bit rate or other constraints. Even with the encoder entirely dropping the Flexbits layer, the compressed bitstream would still decode, albeit at a degraded quality. The decoder could still reconstruct the signal from the normalized coefficients portion alone. This is effectively similar to applying a greater degree of quantization 470 (FIG. 4) in the encoder. The encoding of the bin addresses and sign as a separate flexbits layer also has the potential benefit that in some encoder/decoder implementations, a further variable length entropy coding (e.g., arithmetic coding, Lempel-Ziv, Burrows-Wheeler, etc.) could be applied to the data in this layer for further improved compression.

For layering, sections of the compressed bitstream containing the flexbits portion are signaled by a separate layer header or other indication in the bitstream so that the decoder can identify and separate (i.e., parse) the Flexbits layer 645 (when not omitted) from the core bitstream 640.

Layering presents a further challenge in the design of backward adaptive grouping (described in the following section). Since the Flexbits layer may be present or absent in a given bitstream, the backward-adaptive grouping model cannot reliably refer to any information in the Flexbits layer. All information needed to determine the number of fixed length code bits k (corresponding to the bin size $N=2^k$) should reside in the causal, core bitstream.

2.3 Adaptation

The encoder and decoder further provide a backward-adapting process to adaptively adjust the choice of the number k of fixed length code bits, and correspondingly the bin size N of the grouping described above, during encoding and decoding. In one implementation, the adaptation process can be based on modeling the transform coefficients as a Laplacian distribution, such that the value of k is derived from the Laplacian parameter λ. However, such a sophisticated model would require that the decoder perform the inverse of the grouping 610 (reconstructing the transform coefficients from both the normalized coefficients in the core bitstream 640 and the bin address/sign in the Flexbits layer 645) in FIG. 6 prior to modeling the distribution for future blocks. This requirement would violate the layering constraint that the decoder should permit dropping the Flexbits layer from the compressed bitstream 420.

Figure 9:
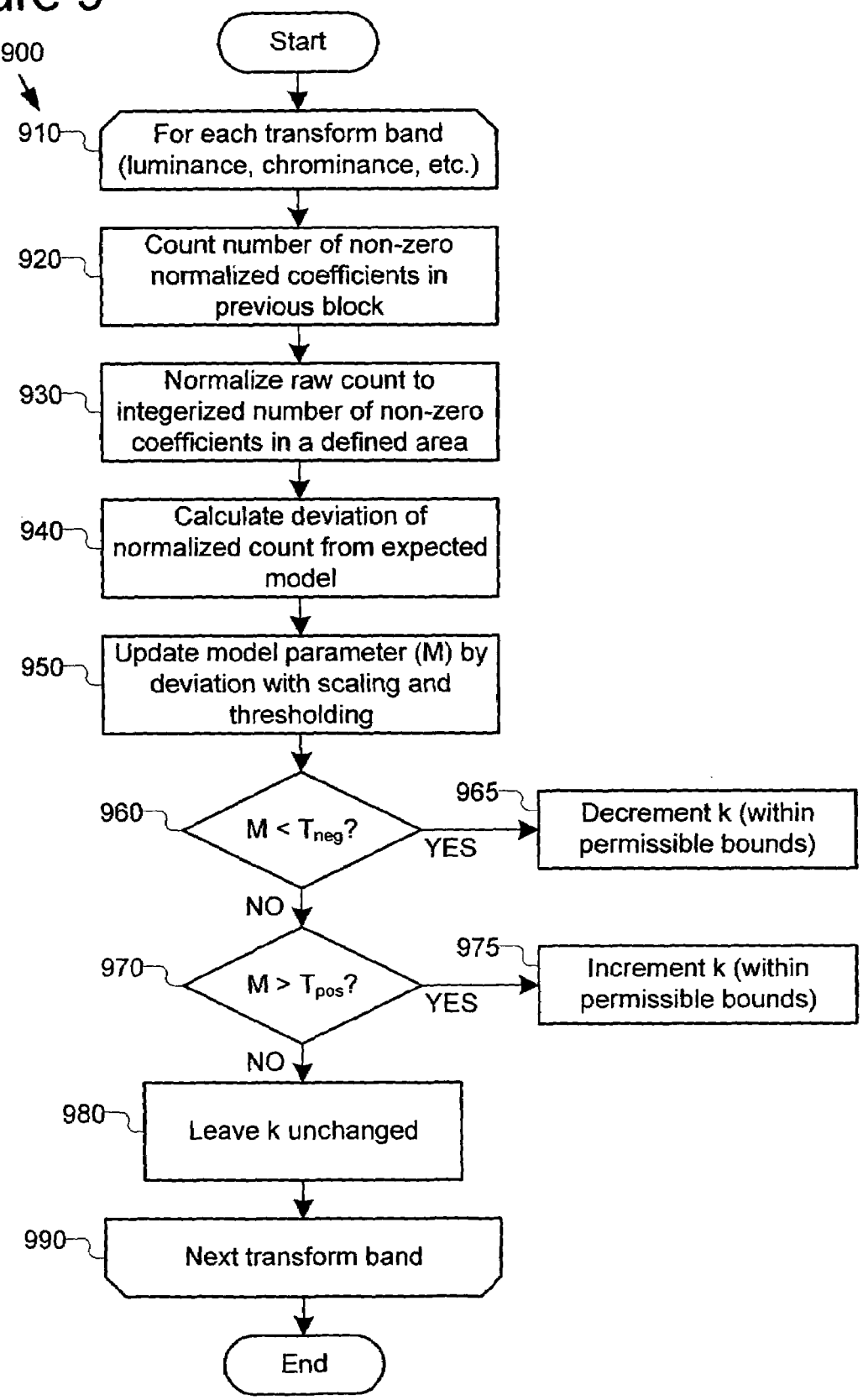
FIG. 9 is a flow chart showing an adaptation process for adaptively varying the grouping in FIG. 6 to produce a more optimal distribution for entropy coding of the coefficients.

In the example implementation shown in FIG. 9, the adaptation process 900 is instead based on the observation that a more optimal run-length encoding of the transform coefficients is achieved when around one quarter of the coefficients are non-zero. Thus, an adaptation parameter that can be used to tune the grouping towards a "sweet-spot" situation where around three-fourths of the normalized coefficients are zero will provide good entropy coding performance. Accordingly, the number of non-zero normalized coefficients in a block is used as the adaptation parameter in the example implementation. This adaptation parameter has the advantage that it depends only upon the information contained in the core bitstream, which meets the layering constraint that the transform coefficients can still be decoded with the Flexbits layer omitted. The process is a backward adaptation in the sense that the adaptation model applied when encoding/decoding the current block is based on information from the previous block(s).

In its adaptation process, the example encoder and decoder performs the adaptation on a backward adaptation basis. That is to say, a current iteration of the adaptation is based on information previously seen in the encoding or decoding process, such as in the previous block or macroblock. In the example encoder and decoder, the adaptation update occurs once per macroblock for a given transform band, which is intended to minimize latency and cross dependence. Alternative codec implementations can perform the adaptation at different intervals, such as after each transform block.

In the example encoder and decoder, the adaptation process 900 updates the value k. If the number of non-zero normalized coefficient is too large, then k is bumped up so that this number will tend to drop in future blocks. If the number of non-zero normalized coefficients is too small, then k is reduced with the expectation that future blocks will then produce more non-zero normalized coefficients because the bin size N is smaller. The example adaptation process constrains the value k to be within the set of numbers {0, 1, . . . 16}, but alternative implementations could use other ranges of values for k. At each adaptation update, the encoder and decoder either increments, decrements, or leaves k unchanged. The example encoder and decoder increments or decrements k by one, but alternative implementations could use other step sizes.

The adaptation process 900 in the example encoder and decoder further uses an internal model parameter or state variable (M) to control updating of the grouping parameter k with a hysteresis effect. This model parameter provides a lag before updating the grouping parameter k, so as to avoid causing rapid fluctuation in the grouping parameter. The model parameter in the example adaptation process has 16 integer steps, from −8 to 8.

With reference now to FIG. 9, the example adaptation process 900 proceeds as follows. This example adaptation process is further detailed in the pseudo-code listing of FIGS. 10 and 11. At indicated at actions 910, 990, the adaptation process in the example encoder and decoder is performed separately on each transform band being represented in the compressed bitstream, including the luminance band and chrominance bands, AC and DC coefficients, etc. Alternative codecs can have vary in the number of transform bands, and further can apply adaptation separately or jointly to the transform bands.

At action 920, the adaptation process then counts the number of non-zero normalized coefficients of the transform band within the immediate previously encoded/decoded macroblock. At action 930, this raw count is normalized to reflect the integerized number of non-zero coefficients in a regular size area The adaptation process then calculates (action 940) the deviation of the count from the desired model (i.e., the "sweet-spot" of one quarter of the coefficients being non-zero). For example, a macroblock of AC coefficients in the example encoder shown in FIG. 4 has 240 coefficients. So, the desired model is for 70 out of the 240 coefficients to be non-zero. The deviation is further scaled, thresholded, and used to update the internal model parameter.

At next actions 960, 965, 970, 975, the adaptation process then adapts the value k according to any change in the internal model parameter. If the model parameter is less than a negative threshold, the value k is decremented (within its permissible bounds). This adaptation should produce more non-zero coefficients. On the other hand, if the model parameter exceeds a positive threshold, the value k is incremented (within permissible bounds). Such adaptation should produce fewer non-zero coefficients. The value k is otherwise left unchanged.

Again, as indicated at actions 910, 980, the adaptation process is repeated separately for each channel and sub-band of the data, such as separately for the chrominance and luminance channels.

The example adaptation process 900 is further detailed in the pseudo-code listing 1000 shown in FIGS. 10 and 11.

3. Computing Environment

The above described encoder 400 (FIG. 4) and decoder 500 (FIG. 5) and techniques for adaptive coding/decoding of wide range coefficients can be performed on any of a variety of devices in which digital media signal processing is performed, including among other examples, computers; image and video recording, transmission and receiving equipment; portable video players; video conferencing; and etc. The digital media coding techniques can be implemented in hardware circuitry, as well as in digital media processing software executing within a computer or other computing environment, such as shown in FIG. 12.

Figure 12:
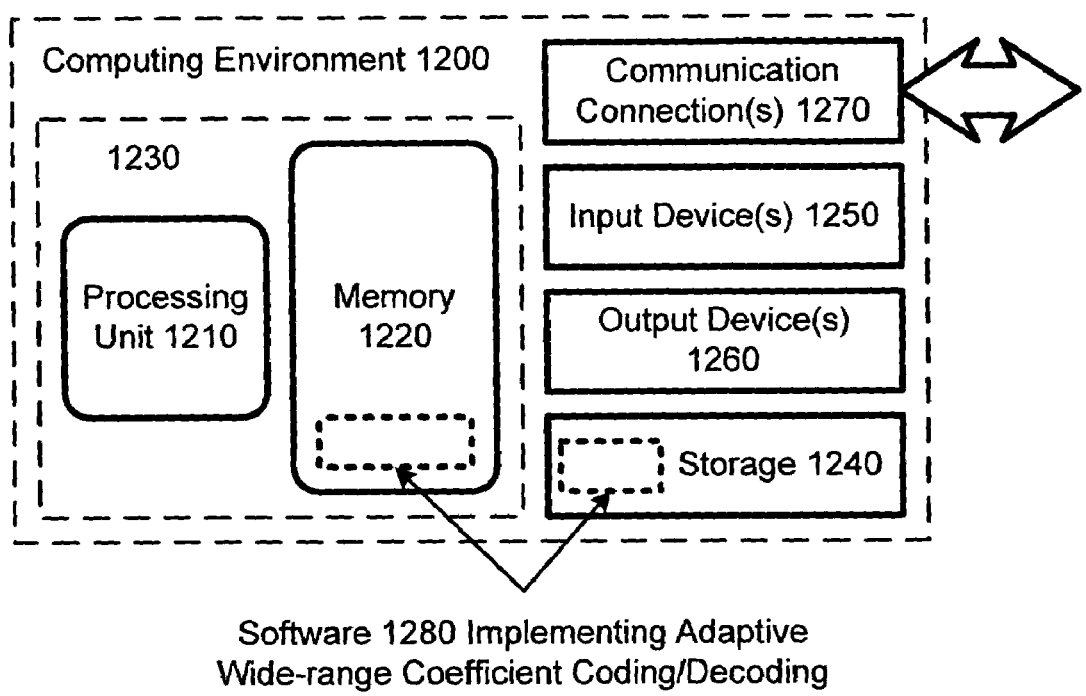
FIG. 12 is a block diagram of a suitable computing environment for implementing the adaptive coding of wide range coefficients of FIG. 6.

FIG. 12 illustrates a generalized example of a suitable computing environment (1200) in which described embodiments may be implemented. The computing environment (1200) is not intended to suggest any limitation as to scope of use or functionality of the invention, as the present invention may be implemented in diverse general-purpose or special-purpose computing environments.

With reference to FIG. 12, the computing environment (1200) includes at least one processing unit (1210) and memory (1220). In FIG. 12, this most basic configuration (1230) is included within a dashed line. The processing unit (1210) executes computer-executable instructions and may be a real or a virtual processor. In a multi-processing system, multiple processing units execute computer-executable instructions to increase processing power. The memory (1220) may be volatile memory (e.g., registers, cache, RAM), non-volatile memory (e.g., ROM, EEPROM, flash memory, etc.), or some combination of the two. The memory (1220) stores software (1280) implementing the described encoder/decoder and wide-range coefficient encoding/decoding techniques.

A computing environment may have additional features. For example, the computing environment (1200) includes storage (1240), one or more input devices (1250), one or more output devices (1260), and one or more communication connections (1270). An interconnection mechanism (not shown) such as a bus, controller, or network interconnects the components of the computing environment (1200). Typically, operating system software (not shown) provides an operating environment for other software executing in the computing environment (1200), and coordinates activities of the components of the computing environment (1200).

The storage (1240) may be removable or non-removable, and includes magnetic disks, magnetic tapes or cassettes, CD-ROMs, CD-RWs, DVDs, or any other medium which can be used to store information and which can be accessed within the computing environment (1200). The storage (1240) stores instructions for the software (1280) implementing the described encoder/decoder and wide-range coefficient encoding/decoding techniques.

The input device(s) (1250) may be a touch input device such as a keyboard, mouse, pen, or trackball, a voice input device, a scanning device, or another device that provides input to the computing environment (1200). For audio, the input device(s) (1250) may be a sound card or similar device that accepts audio input in analog or digital form, or a CD-ROM reader that provides audio samples to the computing environment. The output device(s) (1260) may be a display, printer, speaker, CD-writer, or another device that provides output from the computing environment (1200).

The communication connection(s) (1270) enable communication over a communication medium to another computing entity. The communication medium conveys information such as computer-executable instructions, compressed audio or video information, or other data in a modulated data signal.

A modulated data signal is a signal that has one or more of its characteristics set or changed in such a manner as to encode information in the signal. By way of example, and not limitation, communication media include wired or wireless techniques implemented with an electrical, optical, RF, infrared, acoustic, or other carrier.

The digital media processing techniques herein can be described in the general context of computer-readable media. Computer-readable media are any available media that can be accessed within a computing environment. By way of example, and not limitation, with the computing environment (1200), computer-readable media include memory (1220), storage (1240), communication media, and combinations of any of the above.

The digital media processing techniques herein can be described in the general context of computer-executable instructions, such as those included in program modules, being executed in a computing environment on a target real or virtual processor. Generally, program modules include routines, programs, libraries, objects, classes, components, data structures, etc. that perform particular tasks or implement particular abstract data types. The functionality of the program modules may be combined or split between program modules as desired in various embodiments. Computer-executable instructions for program modules may be executed within a local or distributed computing environment.

For the sake of presentation, the detailed description uses terms like "determine," "generate," "adjust," and "apply" to describe computer operations in a computing environment. These terms are high-level abstractions for operations performed by a computer, and should not be confused with acts performed by a human being. The actual computer operations corresponding to these terms vary depending on implementation.

In view of the many possible variations of the subject matter described herein, we claim as our invention all such embodiments as may come within the scope of the following claims and equivalents thereto.

I claim:

1. A method of encoding digital media data in a computing environment comprising a processor and a memory, the method comprising:
   the processor applying a transform to blocks of the digital media data to produce a set of transform coefficients for the respective blocks;
   for a grouping of plural coefficient values into plural coefficient groups, the processor determining a normalized part and an address part of the transform coefficients of a block, where the normalized part is indicative of a group containing the respective transform coefficient's value and the address part is indicative of an address of the respective transform coefficient's value in the group, where the normalized part and the address part are separate values;
   the processor encoding the normalized part of a transform coefficient using a variable length entropy coding in a compressed bitstream; and
   the processor encoding the address part of a transform coefficient using a fixed length coding in the compressed bitstream.

2. The method of claim 1, further comprising:
   the processor selecting the grouping for a block such that the plural coefficient groups contain a number of coefficient values equal to a power of two.

3. The method of claim 2, wherein the processor determining the normalized part and the address part of the transform coefficients comprises:
   the processor determining the normalized part (Y) of a transform coefficient (X) according to a first relation, $Y=\text{sign}(X)*\text{floor}(\text{abs}(X)/N)$, where N is a number of coefficient values per group; and
   the processor determining the address part (Z) of the transform coefficient according to a second relation, $Z=\text{abs}(X)\% N$.

4. The method of claim 3, further comprising:
   in a case that the normalized part is zero and the address part is non-zero, the processor encoding a sign of the transform coefficient in the compressed bitstream, and otherwise omitting to encode the sign in the compressed bitstream.

5. A method of decoding digital media data encoded according to the method of claim 3, wherein the processor is a first processor, the decoding method further comprising:
   a second processor decoding the normalized part and address part of a transform coefficient from the compressed bitstream, where the normalized part and the address part are separate values;
   in a case that the normalized part is greater than zero, the second processor reconstructing the transform coefficient according to a third relation, $X=Y*N+Z$;
   in a case that the normalized part is less than zero, the second processor reconstructing the transform coefficient according to a fourth relation, $X=Y*N-Z$;
   in a case that the normalized part and the address part are both zero, the second processor reconstructing the transform coefficient to also be zero; and
   in a case that the normalized part is zero and the address part is non-zero, the second processor reading the sign from the compressed bitstream and reconstructing the transform coefficient as a function of the address part and sign.

6. The method of claim 1, further comprising:
   the processor encoding the compressed bitstream in accordance with a multi-layer bitstream syntax structure, the syntax structure comprising a core portion and an optional layer, where the core portion contains sufficient information such that a representation of the digital media data can be decoded and reconstructed without reference to the optional layer based solely on the core portion of the compressed bitstream;
   the processor encoding the normalized parts of the transform coefficients in the core portion of the compressed bitstream; and
   the processor encoding the address parts of the transform coefficients in the optional layer of the compressed bitstream.

7. The method of claim 6, further comprising:
   the processor performing a further entropy coding of the fixed length coded address parts of the transform coefficients.

8. The method of claim 6, further comprising:
   the processor adaptively varying the grouping applied to a current block based on an observed probability distribution characteristic of transform coefficient values of at least one previous block.

9. The method of claim 8, wherein the adaptively varying the grouping is based solely on information contained in the core portion of the compressed bitstream.

10. The method of claim 1, further comprising:
    the processor adaptively varying the grouping applied to a current block based on an observed probability distribution characteristic of transform coefficient values of at least one previous block.

11. The method of claim 10, wherein the adaptively varying the grouping comprises:
   the processor counting occurrences of non-zero transform coefficients in the at least one previous block; and
   the processor adjusting size of the coefficient groups in the grouping applied to the current block based on the count of transform coefficients having a non-zero normalized part in the at least one previous block so as to thereby more likely produce a probability distribution of the normalized part of the transform coefficients in the current block better suited to more efficiently compress the normalized part of the transform coefficients using the variable length coding.

12. The method of claim 11, wherein the adaptively varying the grouping further comprises:
   upon detecting that a trend in the count of non-zero normalized part of the transform coefficients is below a threshold, the processor decreasing the size of the coefficient groups such that the probability distribution of the normalized part of the transform coefficients in the current block will more likely contain more non-zero normalized parts; and
   upon detecting that a trend in the count of non-zero normalized part of the transform coefficients is above a threshold, the processor increasing the size of the coefficient groups such that the probability distribution of the normalized part of the transform coefficients in the current block will more likely contain fewer non-zero normalized parts.

13. A digital media decoder comprising:
   a data storage buffer for storing digital media data to be decoded;
   a processor programmed to:
      adaptively vary a grouping of transform coefficient values into plural coefficient groups for a current block of the digital media data based on an observed characteristic of a probability distribution of previous transform coefficients;
      determine a normalized part and an address part of transform coefficients of a current block, where the normalized part is indicative of a coefficient group containing the respective transform coefficient's value and the address part differentiates the transform coefficient's value within the coefficient group, where the normalized part and the address part are separate values;
      decode the normalized part using a variable length coding; and
      decode the address part using a fixed length coding.

14. The digital media decoder of claim 13 wherein the processor is further programmed to:
   decode the normalized parts of the transform coefficients in a core portion of a compressed bitstream in accordance with a multi-layer bitstream syntax structure having the core portion and an optional layer, where the core portion contains sufficient information to decode and at least approximately reconstruct the digital media data without reference to the information in the optional layer; and
   decode the address parts of the transform coefficients in the optional layer.

15. The digital media decoder of claim 13 wherein the grouping of coefficient values is by coefficient groups having a size in number of coefficients equal to a power of two, and wherein the processor being programmed to determine the normalized part and the address part comprises the processor quantizing the transform coefficient by the power of two to determine the normalized part, and taking a remainder of integer division of the transform coefficient by the power of two as the address part.

16. The digital media decoder of claim 13 wherein the processor is further programmed to decode a sign of the transform coefficient only when the normalized part is zero and the address part is non-zero.

17. At least one computer-readable recording medium carrying a computer-executable digital media processing program thereon for causing one or more processors to perform a method of processing digital media data, the method comprising:
   the one or more processors adaptively varying a grouping of transform coefficient values into plural coefficient groups for a current block of the digital media data based on an observed characteristic of a probability distribution of previous transform coefficients;
   the one or more processors determining a normalized part and an address part of transform coefficients of a current block, where the normalized part is indicative of a coefficient group containing the respective transform coefficient's value and the address part differentiates the transform coefficient's value within the coefficient group, where the normalized part and the address part are separate values;
   the one or more processors encoding or decoding the normalized part using a variable length coding; and
   the one or more processors encoding or decoding the address part using a fixed length coding.

18. The at least one computer-readable recording medium of claim 17 wherein the method further comprises:
   the one or more processors encoding or decoding the normalized parts of the transform coefficients in a core portion of a compressed bitstream in accordance with a multi-layer bitstream syntax structure having the core portion and an optional layer, where the core portion contains sufficient information to decode and at least approximately reconstruct the digital media data without reference to the information in the optional layer; and
   the one or more processors encoding or decoding the address parts of the transform coefficients in the optional layer.

19. One or more computer-readable recording media containing instructions for causing one or more processors to perform a method of encoding digital media data, the method comprising:
   the one or more processors applying a transform to blocks of the digital media data to produce a set of transform coefficients for the respective blocks;
   for a grouping of plural coefficient values into plural coefficient groups, the one or more processors determining a normalized part and an address part of the transform coefficients of a block, where the normalized part is indicative of a group containing the respective transform coefficient's value and the address part is indicative of an address of the respective transform coefficient's value in the group, where the normalized part and the address part are separate values;
   the one or more processors adaptively varying the grouping applied to a current block based on an observed probability distribution characteristic of transform coefficient values of at least one previous block by counting occurrences of non-zero transform coefficients in the at least one previous block and adjusting size of the coefficient groups in the grouping applied to the current block based on the count of transform coefficients having a non-zero normalized part in the at least one previous block so as to thereby more likely produce a probability distribution of the normalized part of the transform coefficients in the current block better suited to more efficiently compress the normalized part of the transform coefficients using the variable length coding;

the one or more processors encoding the normalized part of a transform coefficient using a variable length entropy coding in a compressed bitstream; and the one or more processors encoding the address part of a transform coefficient using a fixed length coding in the compressed bitstream.

20. A digital media encoder comprising:

a data storage buffer for storing digital media data to be encoded;

a processor programmed to:

adaptively vary a grouping of transform coefficient values into plural coefficient groups for a current block of the digital media data based on an observed characteristic of a probability distribution of previous transform coefficients;

determine a normalized part and an address part of transform coefficients of a current block, where the normalized part is indicative of a coefficient group containing the respective transform coefficient's value and the address part differentiates the transform coefficient's value within the coefficient group, where the normalized part and the address part are separate values;

encode the normalized part using a variable length coding; and encode the address part using a fixed length coding.

21. The digital media encoder of claim 20 wherein the processor is further programmed to:

encode the normalized parts of the transform coefficients in a core portion of a compressed bitstream in accordance with a multi-layer bitstream syntax structure having the core portion and an optional layer, where the core portion contains sufficient information to decode and at least approximately reconstruct the digital media data without reference to the information in the optional layer; and encode the address parts of the transform coefficients in the optional layer.

22. The digital media encoder of claim 20 wherein the grouping of coefficient values is by coefficient groups having a size in number of coefficients equal to a power of two, and wherein the processor being programmed to determine the normalized part and the address part comprises the processor quantizing the transform coefficient by the power of two to determine the normalized part, and taking a remainder of integer division of the transform coefficient by the power of two as the address part.

23. The digital media encoder of claim 20 wherein the processor is further programmed to encode a sign of the transform coefficient only when the normalized part is zero and the address part is non-zero.

* * * * *